(12) United States Patent
Sun et al.

(10) Patent No.: US 11,239,259 B2
(45) Date of Patent: Feb. 1, 2022

(54) SUBSTRATE, MANUFACTURING METHOD THEREOF AND TRANSPARENT DISPLAY DEVICE

(71) Applicant: BOE TECHNOLOGY GROUP CO., LTD., Beijing (CN)

(72) Inventors: Hongda Sun, Beijing (CN); Fengjuan Liu, Beijing (CN); Dini Xie, Beijing (CN); Pengfei Gu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/649,854

(22) PCT Filed: Oct. 15, 2019

(86) PCT No.: PCT/CN2019/111176
§ 371 (c)(1),
(2) Date: Mar. 23, 2020

(87) PCT Pub. No.: WO2020/088236
PCT Pub. Date: May 7, 2020

(65) Prior Publication Data
US 2020/0235138 A1 Jul. 23, 2020

(30) Foreign Application Priority Data
Nov. 1, 2018 (CN) .......................... 201811296849.2

(51) Int. Cl.
*H01L 27/12* (2006.01)
*H01L 23/552* (2006.01)
*H01L 29/786* (2006.01)

(52) U.S. Cl.
CPC ........ *H01L 27/1248* (2013.01); *H01L 23/552* (2013.01); *H01L 27/1259* (2013.01); *H01L 29/78633* (2013.01)

(58) Field of Classification Search
None
See application file for complete search history.

(56) References Cited

U.S. PATENT DOCUMENTS

| 2017/0148856 A1 | 5/2017 | Choi et al. |
| 2018/0013092 A1 | 1/2018 | Park |
| 2018/0040682 A1 | 2/2018 | Ebisuno et al. |
| 2018/0108685 A1 | 4/2018 | Kim |
| 2020/0235138 A1 | 7/2020 | Sun et al. |

FOREIGN PATENT DOCUMENTS

| CN | 106887523 A | 6/2017 |
| CN | 107706208 A | 2/2018 |
| CN | 107958916 A | 4/2018 |
| CN | 109360849 A | 2/2019 |
| KR | 10-2014-0069896 A | 6/2014 |

*Primary Examiner* — Bo B Jang
(74) *Attorney, Agent, or Firm* — The Webb Law Firm

(57) ABSTRACT

The present disclosure provides a substrate, a manufacturing method thereof, and a transparent display device. The substrate comprising: a plurality of pixel units, at least a part of which includes a light-emitting area and a transparent area, and the light-emitting area includes a thin-film transistor; a light blocking member disposed in the light-emitting area and configured to block light that is directed to the thin-film transistor through the transparent area.

13 Claims, 4 Drawing Sheets

SUBSTRATE, MANUFACTURING METHOD THEREOF AND TRANSPARENT DISPLAY DEVICE

CROSS-REFERENCE TO RELATED APPLICATIONS

This is application is a U.S. National Stage under 35 U.S.C. § 371 of International Application No. PCT/CN2019/111176, as filed on Oct. 15, 2019, which claims a priority of a Chinese patent application No. 201811296849.2 entitled "Substrate and Manufacturing Method thereof and Transparent Display Device" that was filed on Nov. 1, 2018, and the contents disclosed in each of these applications are incorporated herein by reference in its entirety.

TECHNICAL FIELD

The present disclosure relates to the technical field of display, and in particular, to a substrate, a manufacturing method thereof, and a transparent display device.

BACKGROUND

At present, display devices are appearing in the display market and the daily life of the public in an increasingly diverse and novel form, such as the liquid crystal display (LCD) devices that are developing towards ultra-high resolution display, the small and medium-sized organic light-emitting display (OLED) devices that are widely used in mobile devices such as mobile phones and Pads, the large-sized OLED display devices that are increasingly mature for television (TV), and novel display technologies such as transparent display devices. Among them, the transparent display device has obtained a good user experience and has broad Market prospects.

SUMMARY

In one aspect of the present disclosure, the present disclosure provides a substrate. According to an embodiment of the present disclosure, the substrate includes: a plurality of pixel units, at least a part of which includes a light-emitting area and a transparent area, and the light-emitting area includes a thin-film transistor; a light blocking member disposed in the light-emitting area and configured to block light that is directed to the thin-film transistor through the transparent area. The inventor found that the substrate has a simple structure and is easy to implement. The light blocking member can effectively prevent light from irradiating the thin-film transistor, and is particularly suitable for blocking light from the transparent area laterally to the thin-film transistor, so that the active layer in the thin-film transistor is effectively protected. Thereby, the problem of deterioration of the Negative Bias Temperature Illumination Stability (NBTIS) of the active layer due to the irradiation of light (especially ultraviolet light) is significantly reduced, thereby effectively ensuring the stability of the thin-film transistor, so that the transparent display device containing the substrate can maintain a high yield during the long-term use which facilitate the satisfaction of the consumption experience of the customers.

According to an embodiment of the present disclosure, the light blocking member includes a reflective layer, the thin-film transistor includes a plurality of insulating layers, and the reflective layer covers at least part of the plurality of insulating layers on a side thereof facing the transparent area.

According to an embodiment of the present disclosure, the insulating layer includes an interlayer insulating layer and a gate insulating layer, or the insulating layer includes an interlayer insulating layer.

According to an embodiment of the present disclosure, an orthographic projection of the reflective layer on the substrate and an orthographic projection of the interlayer insulating layer on the substrate partially overlap with each other.

According to an embodiment of the present disclosure, a material forming the reflective layer includes metal.

According to an embodiment of the present disclosure, the light blocking member further comprises an ultraviolet blocking wall, the ultraviolet blocking wall is located in the light-emitting area, and the reflection layer is located on a side of the reflection layer near the transparent area.

According to an embodiment of the present disclosure, a barrier wall is further provided in the light-emitting area, the barrier wall is located on a side of the reflective layer near the transparent area, and the ultraviolet blocking wall is located in a gap between the reflective layer and the barrier wall.

According to an embodiment of the present disclosure, the barrier wall comprises a first sublayer, a second sublayer, and a third sublayer from bottom to top.

According to an embodiment of the present disclosure, a distance between the reflective layer and the barrier wall is 2-3 micrometers.

According to an embodiment of the present disclosure, the reflective layer covers at least part of the barrier wall on a side thereof facing the thin-film transistor.

According to an embodiment of the present disclosure, the light-emitting area further includes a planarization layer covering the thin-film transistor and the reflective layer, and at least a part of the planarization layer constitutes the ultraviolet blocking wall.

According to an embodiment of the present disclosure, a material forming the ultraviolet blocking wall comprises a material having a transmittance of less than 20%.

According to an embodiment of the present disclosure, a material forming the ultraviolet blocking wall comprises a polyimide-based organic material.

According to an embodiment of the present disclosure, the light-blocking member further comprises a second reflective layer, and the second reflective layer covers at least apart of the plurality of insulating layers on a side thereof facing the transparent area in an adjacent pixel.

In another aspect of the present disclosure, the present disclosure provides a transparent display device. According to an embodiment of the present disclosure, the transparent display device includes the aforementioned substrate. The inventors have found that the transparent display device can maintain high display quality and high product yield during long-term use, which can satisfy the consumption experience of the customers.

In another aspect of the present disclosure, the present disclosure provides a method of fabricating the aforementioned substrate. According to an embodiment of the present disclosure, the method includes: forming the plurality of pixel units; wherein forming at least part of the pixel unit includes forming a thin-film transistor and a light blocking member in the light-emitting area. The inventors found that the manufacturing method is simple, convenient, easy to implement, and low in cost, and it can obtain a substrate with all the features and advantages described above.

According to an embodiment of the present disclosure, the reflective layer and the source and drain electrodes of the thin-film transistor are formed by a single patterning process.

According to an embodiment of the present disclosure, forming at least part of the pixel units further comprises the step of forming a barrier wall, wherein the first sublayer and the buffer layer in the thin-film transistor are formed by a patterning process; the second sublayer and the gate insulation layer in the thin-film transistor are formed by a patterning process; the third sublayer and the interlayer insulating layer in the thin-film transistor are formed by a patterning process.

According to an embodiment of the present disclosure, forming at least a part of the pixel unit further comprises a step of forming a planarization layer, and apart of the planarization layer is filled in a gap between the reflective layer and the barrier wall, and the part of the planarization layer filled in the gap constitutes the ultraviolet blocking wall.

DETAILED DESCRIPTION

Embodiments of the present disclosure are described in detail below. The embodiments described below are exemplary and are only used to explain the present disclosure, and should not be construed as limiting the present disclosure. If the specific technology or condition is not indicated in the examples, the embodiments are performed according to the technology or condition described in the literature in the art or the product description.

This disclosure is made based on the following knowledge and findings of the inventors.

Figure 1:
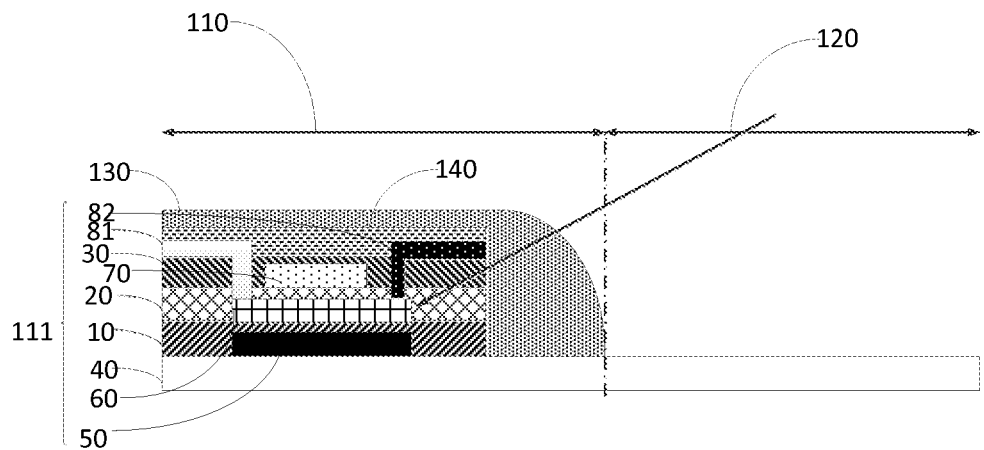
FIG. 1 is a schematic structural diagram of a substrate in the related art.

In a transparent display device, as shown in FIG. 1, due to the existence of the transparent area 120 and the environment in which the transparent display device is used, a large amount of external light enters the light-emitting area 110 from the transparent area 120, which may cause lateral light (For example, UV) leads to the electron migration of the active layer 60 (ACT layer) in the thin-film transistor 111 in the light-emitting area to be affected, and eventually the stability of the thin-film transistor (TFT) 111 device is impaired. In view of the above technical problems, the inventors conducted in-depth research and after the research found that a light-blocking member can be provided in the light-emitting area to block the impact of light from the outside to the transparent area on the thin-film transistor.

Figure 2:
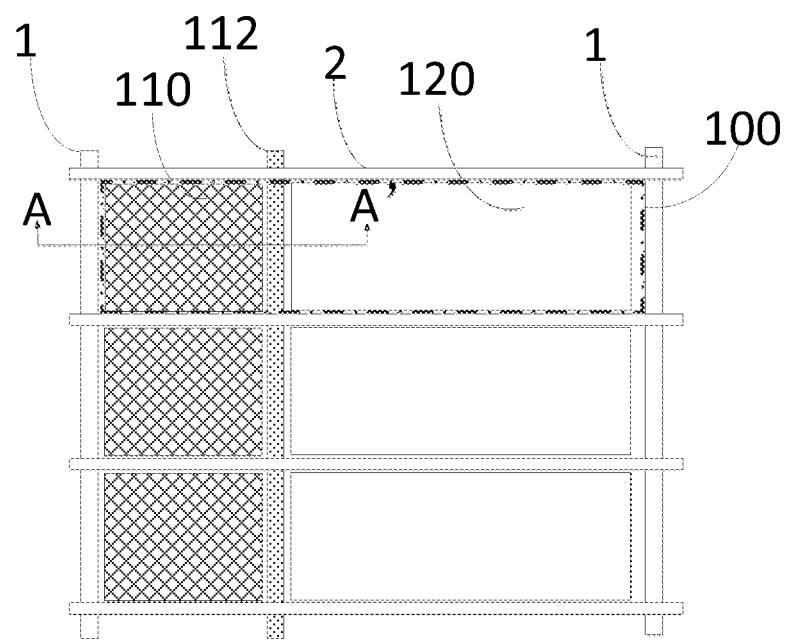
FIG. 2 is a top view of a substrate in some embodiments of the present disclosure.

In view of this, in one aspect of the present disclosure, the present disclosure provides a substrate. According to an embodiment of the present disclosure, referring to FIGS. 2 and 3, the substrate includes: a plurality of pixel units 100, at least part of the pixel units 100 includes a light-emitting area 110 and a transparent area 120, and the light-emitting area 110 includes a thin-film transistor 111; a light blocking member 112 that is disposed in the light-emitting area 110 and is configured to block light that is transmitted to the thin-film transistor through the transparent area. The inventor found that the substrate has a simple structure and is easy to implement, and the light blocking member can effectively reduce light from irradiating to the thin-film transistor, and is particularly suitable for blocking external light from laterally illustrating the thin-film transistor, so that the active layer in the thin-film transistor is effectively protected, and the problem of NBTIS degradation of the active layer caused by light (especially ultraviolet light) irradiation is significantly reduced. Therefore, the light stability of the thin-film transistor is effectively ensured, and the substrate can maintain a high yield during long-term usage, thereby satisfying the consumption experience of the consumer. It can be understood that, referring to FIG. 2, the gate lines 2 and the data lines 1 intersect to define a plurality of pixel units 100. It should be noted that the term "light-emitting area" used in this description includes the thin-film transistors and the light-emitting elements. The thin-film transistors and light-emitting elements are arranged in the same way as the thin-film transistors and light-emitting elements in a conventional pixel unit, that is, the light-emitting elements are arranged so as to correspond to the opening area of the conventional pixel unit, and the thin-film transistor are arranged so as to correspond to the area outside the opening area of the conventional pixel unit. The light-emitting element is not shown in the drawings herein. The expression "at least part of the pixel unit includes a light-emitting area and a transparent area" refers to: 1. all pixel units include light-emitting areas and transparent areas; 2. some pixel units include light-emitting areas and transparent areas, and other pixel units do not include transparent areas; for example, in an array of pixel units, one row of pixel units includes light-emitting areas and transparent areas, and the other row of pixel units does not include a transparent area.

According to an embodiment of the present disclosure, when an oxide semiconductor is used as a material for forming an active layer in a thin-film transistor, the active layer is susceptible to damage caused by light that causes electron migration, thereby reducing the performance of the thin-film transistor. Therefore, the above structure of the light-emitting areas of the present application is beneficial to reduce external light entering the thin-film transistor, thereby ensuring the performance of the thin-film transistor.

According to the embodiment of the present disclosure, the thin-film transistor can be a top-gate thin-film transistor, a bottom-gate thin-film transistor, a back channel etched (BCE) thin-film transistor, an etch stop layer (ESL) thin-film transistor, and the like. Therefore, the range of use thereof is wide.

Figure 3:
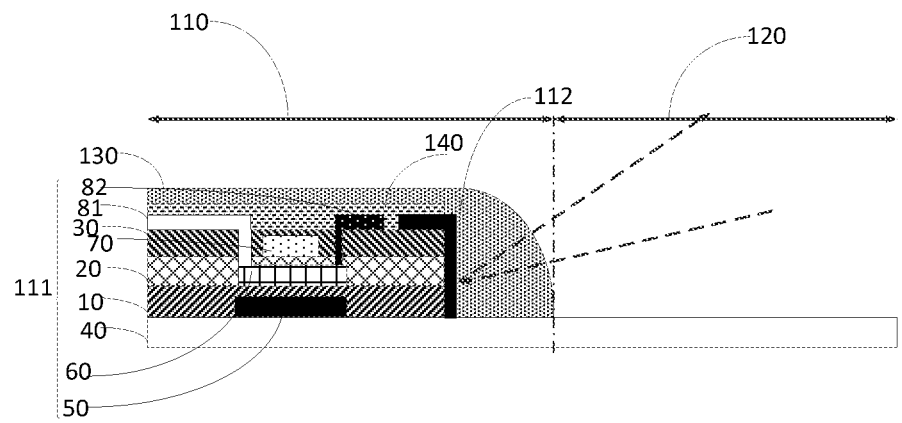
FIG. 3 is a schematic cross-sectional structure taken along the direction AA' in FIG. 2.
Figure 4:
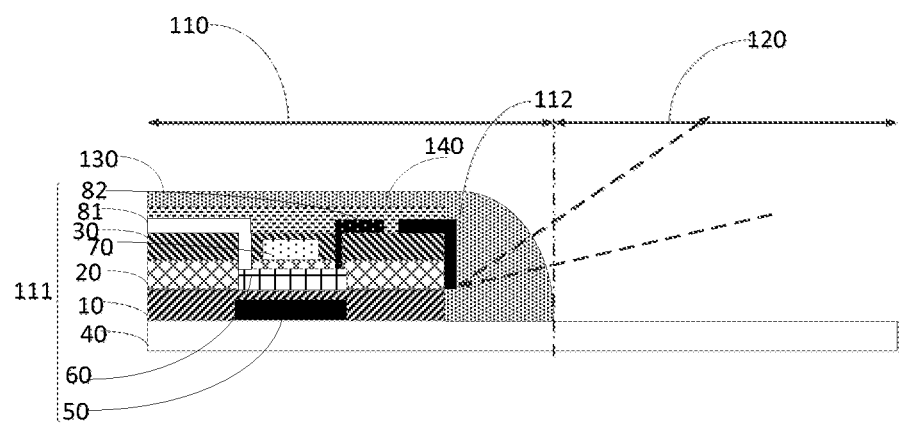
FIG. 4 is a schematic structural diagram of a substrate in some embodiments of the present disclosure.
Figure 5:
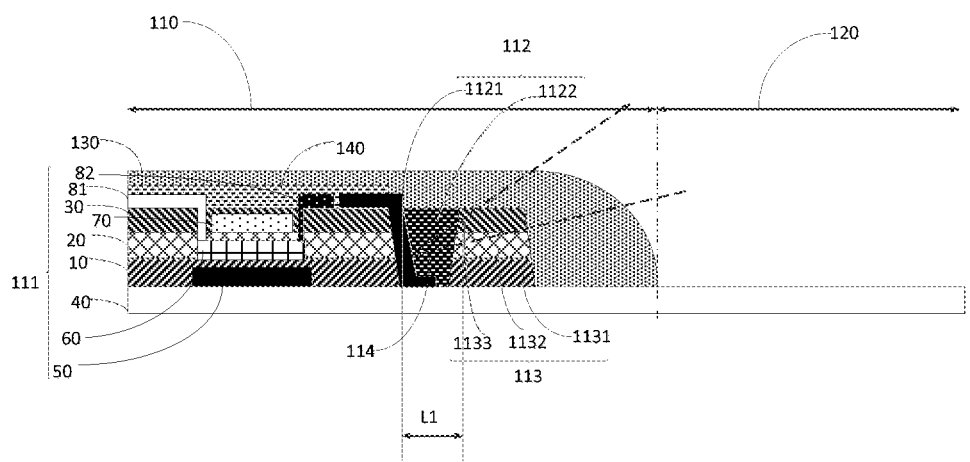
FIG. 5 is a schematic structural diagram of a substrate in some embodiments of the present disclosure.

According to an embodiment of the present disclosure, the light blocking member includes a reflective layer, the thin-film transistor includes a plurality of insulating layers, and the reflective layer covers at least part of the plurality of insulating layers on the side thereof facing the transparent areas. In some embodiments of the present disclosure, the insulating layers include an interlayer insulating layer and a gate insulating layer, or the insulating layers include an interlayer insulating layer, that is, a reflective layer may at least cover the interlayer insulating layer of the thin-film transistor on the side thereof facing the transparent areas, or the reflective layer may at least cover the interlayer insulating layer and the gate insulating layer of the thin-film transistor on the side thereof facing the transparent areas. In some embodiments of the present disclosure, the thin-film transistor may be a top-gate thin-film transistor. Referring to FIGS. 3-5, the light blocking member 112 includes a reflective layer 1121, and the reflective layer 1121 is at least disposed on the interlayer insulating layer 30 and the gate insulating layer 20 of the thin-film transistor 111 on the side thereof facing the transparent area 120. In some specific embodiments of the present disclosure, the gate insulating layer of the top-gate thin-film transistor is formed by etching with the gate electrode as a mask. In this case, the reflective layer is disposed on the interlayer insulating layer on the side thereof facing the transparent area. In other embodiments of the present disclosure, the thin-film transistor may be a bottom-gate thin-film transistor, and the reflective layer is disposed on the interlayer insulating layer and the gate insulating layer on a side thereof facing the transparent area. As a result, the reflective layer can reflect the external light (including visible light and ultraviolet light) illustrating the thin-film transistor from the transparent area, which significantly reduces the effect of light on the thin-film transistor. When the material forming the active layer includes an oxide semiconductor, the electron migration of the active layer is hardly affected by light, which effectively ensures the stability of the thin-film transistor. It should be noted that FIG. 3 to FIG. 5 illustrate the present application by using a top-gate thin-film transistor as an example, which cannot be understood as a limitation on the present application.

According to an embodiment of the present disclosure, referring to FIGS. 3 to 5, in order to make the reflective layer 1121 have better structural stability during use, the orthographic projection of the reflective layer 1121 on the substrate and the orthographic projections of the interlayer insulating layer 30 on the substrate partially overlap with each other, so that the structural stability of the reflective layer is higher, the service life is longer, and the reflection effect is better.

Figure 6:
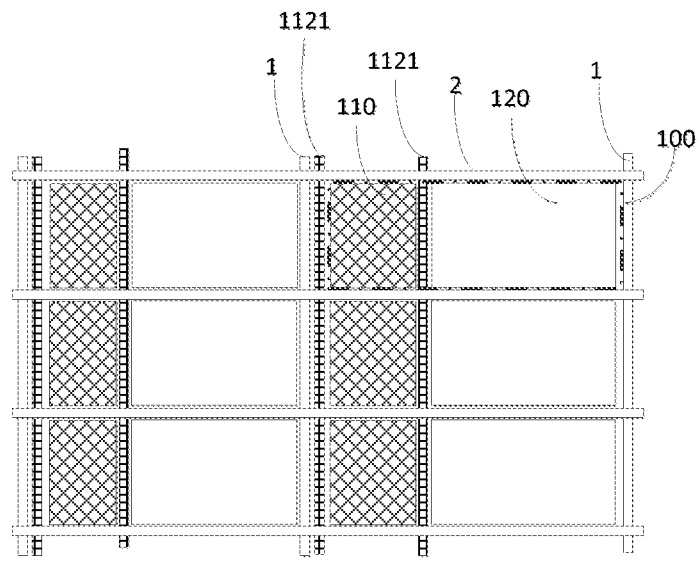
FIG. 6 is a top view of a substrate in some embodiments of the present disclosure.

In some embodiments of the present disclosure, referring to FIG. 6, the thin-film transistor 110 has two sides facing the transparent area 120, and both sides facing the transparent area 120 of the interlayer insulating layer and the gate insulating layer in the thin-film transistor 110 may be provided with a reflective layer 1121 to reduce the effect of light on thin-film transistors.

According to an embodiment of the present disclosure, in order to make the reflection layer reflect light better, a material forming the reflection layer includes metal. As a result, the reflective layer is formed from a wide range of materials, which can effectively reflect visible light, ultraviolet light (UV), etc., and thereby significantly reduce the effect of light on the active layer, so that the thin-film transistor can maintain a high yield during long-term use. In some embodiments of the present disclosure, the aforementioned metals include gold, silver, aluminum, copper, and the like. This allows a wide range of materials and excellent light reflection.

According to an embodiment of the present disclosure, referring to FIG. 5, the light blocking member 112 further includes an ultraviolet blocking wall 1122 disposed on an outer peripheral wall of the reflective layer 1121. Therefore, because the ultraviolet blocking wall has the function of absorbing ultraviolet light, it can effectively absorb the ultraviolet light, so that the light blocking member can better block the ultraviolet light, realize the all-round protection of the active layer, and better protect the thin-film transistor. It can prolong the service life of the thin-film transistor, which is more conducive to extending the service life of the substrate.

According to an embodiment of the present disclosure, a material forming the ultraviolet blocking wall includes a material having a transmittance lower than 20% (for example, 20%, 15%, 10%, 5%, etc.). Therefore, the ultraviolet blocking wall has a low transmittance of ultraviolet light, which is beneficial for preventing ultraviolet light from irradiating the thin-film transistor, and has a better effect of protecting the active layer.

According to an embodiment of the present disclosure, a material forming the ultraviolet blocking wall includes a polyimide-based organic material. Therefore, the material has a wide range of sources, and has a low transmittance to ultraviolet light. The effect of preventing ultraviolet light from irradiating the thin-film transistor is better, and the effect of protecting the thin-film transistor is better.

According to an embodiment of the present disclosure, referring to FIG. 5, a barrier wall 113 is further provided in the light-emitting area 110. The barrier wall 113 is located on a side of the reflective layer 1121 near the transparent area 120. The ultraviolet blocking wall 1122 is located in a gap between the reflective layer 1121 and the barrier wall 113. Therefore, the barrier wall can reduce the intrusion of defects or water vapor. More specifically, the barrier wall can reduce the defect intrusion or water vapor intrusion caused by the incomplete curing of the filler glue, so that the problems caused by the incomplete curing of the sealant can spread to the light-emitting area as little as possible, and reduce the loss of the light-emitting area. Further, filling the ultraviolet blocking wall into the gap between the reflective layer and the barrier wall can further reduce the damage of the thin-film transistor by ultraviolet light.

According to the embodiment of the present disclosure, the width of the barrier wall is less than 3 micrometers (for example, 3 micrometers, 2.5 micrometers, 2 micrometers, 1.5 micrometers, etc.). Therefore, the barrier wall reduces defect intrusion or water vapor intrusion caused by the incomplete curing of the external encapsulant. In this way, the problems that occur when the encapsulant is not fully cured can reach the light-emitting area as little as possible, and the effect of reducing the loss of the light-emitting area is better. When the width of the barrier wall is too large, the transparency effect of the substrate is affected.

According to an embodiment of the present disclosure, referring to FIG. 5, the barrier wall 113 includes a first sublayer 1131, a second sublayer 1132, and a third sublayer 1133 from bottom to top. Therefore, the barrier wall can reduce the defect intrusion or water vapor intrusion caused by the incomplete curing of the external encapsulant, so that the problems caused by the incomplete curing of the encapsulant can reach the light-emitting area as little as possible, and the effect of reducing the loss of the light-emitting area is better. According to the embodiments of the present disclosure, the first sublayer, the second sublayer, and the third sublayer may be formed separately, or may be formed simultaneously with other processes. In some embodiments of the present disclosure, the first sublayer 1131 of the barrier wall and the buffer layer 10 in the thin-film transistor 111 are formed by a single patterning process, and/or the second sublayer 1132 and the gate insulating layer 20 are formed by a single patterning process, and/or the third sublayer 1133 and the interlayer insulating layer 30 are formed by a single patterning process. Therefore, the manufacturing process of the barrier wall can be effectively simplified by the single patterning process, which is beneficial to reducing the production costs. In some embodiments of the present disclosure, the material forming the buffer layer includes, but is not limited to, silicon oxide, and the like. The material forming the gate insulating layer includes, but is not limited to, polymethyl methacrylate, polyvinyl phenol, and the like. The material forming the interlayer insulating layer includes, but is not limited to, resins and the like. Therefore, the materials are widely available, with low price and good performance. It should be noted that the description "upper" used herein refers to the direction in which the substrate faces the user during use, and "down" refers to the direction in which the substrate is away from the user during use.

According to an embodiment of the present disclosure, referring to FIG. 5, a distance L1 between the reflective layer 1121 and the barrier wall 113 is 2-3 microns (for example, 2 microns, 2.2 microns, 2.4 microns, 2.6 microns, 2.8 microns, 3 microns, etc.). As a result, the ultraviolet blocking walls can be filled between the reflective layer and the barrier wall as many as possible, and the effect of preventing ultraviolet light from irradiating the reflective layer is better. Therefore, the effect of light on the active layer can be further reduced, and a full range of active layers protection is achieved. When the distance between the reflective layer and the barrier wall is too large, the area occupied by the transparent area will be reduced, and the overall transmittance of the pixel will be reduced. When the distance between the reflective layer and the barrier wall is too small, the blocking effect of barrier wall will be relatively poor. It should be noted that the distance between the reflective layer and the barrier wall refers to the maximum distance between the reflective layer and the barrier wall in the direction from the light-emitting area to the transparent area.

In some embodiments of the present disclosure, referring to FIG. 5, the barrier wall 113 is formed after the buffer layer 10, the gate insulating layer 20, and the interlayer insulating layer 30 are etched, and a groove 114 is formed between the thin-film transistor 111 and the barrier wall 113. Therefore, although the provision of the groove will make the width of the light-emitting area (for example, 5 micrometers) wider than the width of the light-emitting area in the related art, the groove can be used to separate the light-emitting area from the transparent area. Moreover, filling the groove with a material with a low transmittance can prevent light from entering the thin-film transistor, reduce the loss of the thin-film transistor, improve the yield of the product, and extend the service life of the product. According to the embodiment of the present disclosure, the shape of the groove is not particularly limited, those skilled in the art can flexibly select it according to actual needs, as long as the requirements can be met. For example, the cross-sectional shape of the groove may be rectangular, trapezoidal, or the like. According to the embodiment of the present disclosure, the method for forming the groove includes, but is not limited to, etching, and so on, the operation thereof is simple, convenient, and easy to implement.

According to the embodiment of the present disclosure, the shape of the barrier wall is not particularly limited, those skilled in the art can flexibly select it according to actual needs, as long as the requirements can be met. For example, the cross-sectional shape of the barrier wall may be rectangular or trapezoidal.

Figure 8:
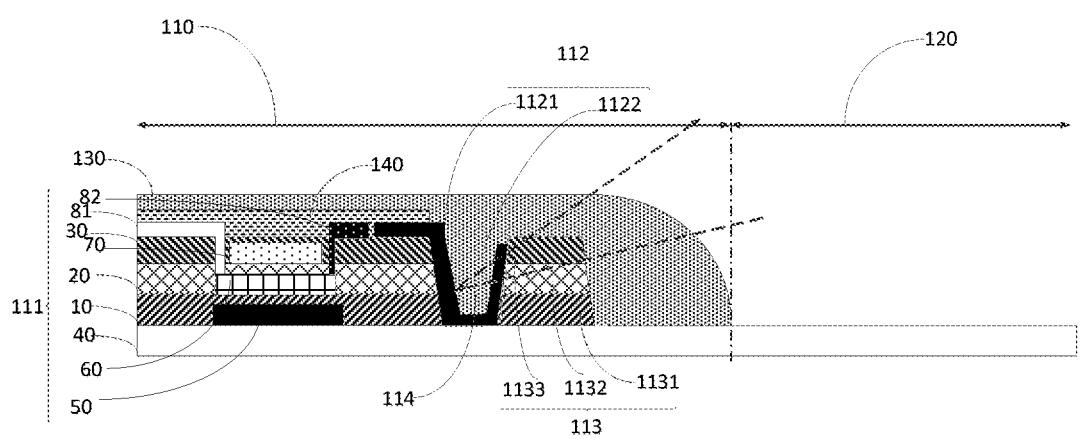
FIG. 8 is a schematic structural diagram of a substrate in some embodiments of the present disclosure.

According to an embodiment of the present disclosure, referring to FIG. 8, the reflective layer 1121 may also cover the barrier wall 113 on at least the side thereof facing the thin-film transistor 111. Therefore, the reflective layer has a better effect of reflecting external light and a better effect of protecting the active layer.

Figure 7:
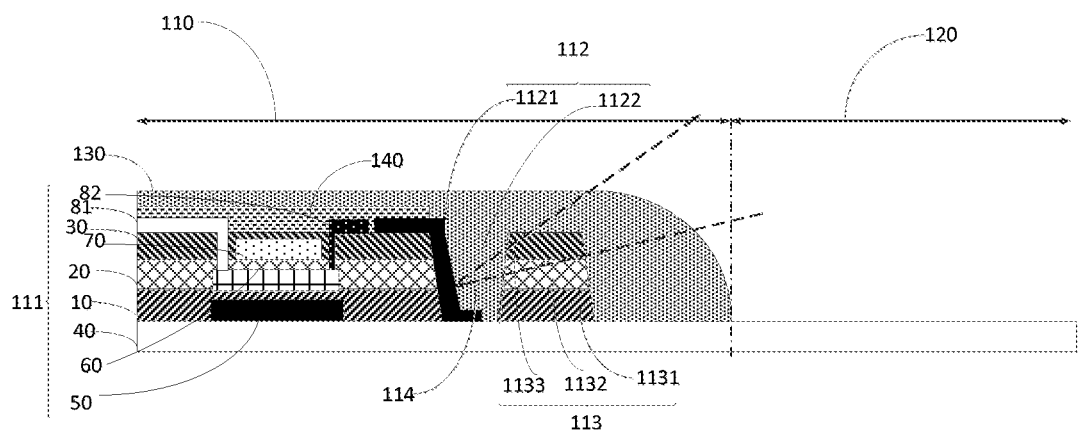
FIG. 7 is a schematic structural diagram of a substrate in some embodiments of the present disclosure.

According to an embodiment of the present disclosure, referring to FIG. 7, the light-emitting area further includes a planarization layer 130 covering the thin-film transistor 111 and the reflective layer 1121. At least a part of the planarization layer 130 constitutes the ultraviolet blocking wall 1122. Therefore, the ultraviolet blocking wall and the planarization layer can be formed by a single process, which effectively simplifies the manufacturing process and reduces the production cost. Also, the entire planarization layer and the ultraviolet blocking wall are made of the same material, which can further improve the effect of blocking UV light transmission and effectively realize the effect of full protection of the active layer.

According to an embodiment of the present disclosure, referring to FIG. 7, the light-emitting area 1 further includes a passivation layer 140 that is located between the planarization layer 130 and the thin-film transistor 111 and covers the source electrode 81 and the drain electrode 82 of the thin-film transistor 111, and part of the reflective layer 1121. Therefore, the passivation layer can effectively block water and oxygen, and effectively protect the thin-film transistor.

In some specific embodiments of the present disclosure, a top-gate thin-film transistor is used as an example of the thin-film transistor in a light-emitting area to describe a structure of a substrate. It should be noted that the following description is only used to explain the application, and cannot be understood as limitations to the application. Specifically, referring to FIG. 7, the substrate includes a plurality of pixel units, wherein each pixel unit includes a light-emitting area 110 and a transparent area 120. The light-emitting area 110 includes: a substrate 40; a shield layer 50 disposed on a first surface of the substrate 40; a buffer layer 10 disposed on the first surface of the substrate 40 and covering the shield layer 50; an active layer (ACT) 60 disposed on the surface of the buffer layer 10 away from the substrate 40; a gate insulation layer (GI) 20 disposed on the surface of the buffer layer away from the substrate 40 and covering the active layer 60; a gate electrode 70 disposed on the surface of the gate insulation layer 20 away from the substrate 40; an interlayer insulation layer (ILD) 30 disposed on the surface of the gate insulating layer 20 away from the substrate 40 and covering the gate electrode 70; a source electrode 81 and a drain electrode 82 provided on the surface of the interlayer insulating layer 30 away from the substrate 40, and the source electrode 81 and the drain electrode 82 are electrically connected to the active layer 60 through the via; a reflective layer 1121 disposed on the surface of the interlayer insulating layer 30 away from the substrate 40, wherein the reflective layer 1121 is formed by a single patterning process along with the source electrode 81 and the drain electrode 82; a barrier wall 113, including a first sublayer 1131, a second sublayer 1132, and a third sublayer 1133, wherein the first sublayer 1131 and the buffer layer 10 are formed by a single patterning process, the second sublayer 1132 and the gate insulating layer 20 are formed by a single patterning process, and the third sublayer 1133 and the interlayer insulating layer 30 are formed by a single patterning process; a passivation layer (PVX) 140 provided on the surface of the interlayer insulating layer 30 away from the substrate 40 and covering apart of the surface of the source electrode 81, the drain electrode 82, and the reflective layer 1121; a planarization layer (or resin layer) 130 provided on the first surface of the substrate 40 and covering the passivation layer 140, the reflective layer 1121, and the barrier wall 113, and a part of the planarization layer 130 filled in the gap between the reflective layer 1121 and the barrier wall 113 simultaneously serves as the ultraviolet blocking wall 1122. Therefore, the shiled layer, which is formed of metal or the like, can effectively block external light incident from the substrate side, reducing the effect on the active layer, and the light incident from the transparent area has less effect on the thin-film transistor. It should be noted that the source and drain electrodes are electrically connected to the conductive area of the active layer, and the conductive area of the active layer is not shown in the figure.

According to an embodiment of the present disclosure, the light-emitting area further includes a pixel defining layer (PDL) disposed on a surface of the planarization layer away from the substrate; an anode (Anode) disposed in the light-emitting area and located in a gap defined by the pixel defining layer; a light-emitting layer disposed on the surface of the anode away from the substrate; a cathode disposed on the surface of the light-emitting layer away from the substrate and covering the light-emitting layer and the pixel defining layer. Thereby, the light-emitting function of the light-emitting area can be effectively realized.

In another aspect of the present disclosure, the present disclosure provides a transparent display device. According to an embodiment of the present disclosure, the transparent display device includes the aforementioned substrate. The inventors have found that the transparent display device can maintain high display quality and high product yield during long-term use, which can satisfy the consumption experience of the consumers.

According to the embodiments of the present disclosure, in addition to the substrate described above, the transparent display device may include structures such as a package structure, a wiring, and the like, and details thereof are not described herein.

In another aspect of the present disclosure, the present disclosure provides a method of fabricating the aforementioned substrate. According to an embodiment of the present disclosure, the method includes: forming a plurality of pixel units, at least part of the pixel units includes a light-emitting area and a transparent area; wherein forming the at least part of the pixel units includes: forming a thin-film transistor and a light blocking member in the light-emitting area, the light blocking member is used to block the effect of light from the outside towards the transparent area on the thin-film transistor. The inventors have found that the manufacturing method is simple, convenient, easy to implement, and low in cost, and a substrate having all the features and advantages described above can be obtained.

According to an embodiment of the present disclosure, the light blocking member includes a reflective layer, and the reflective layer may be formed separately or may be formed in synchronization with other processes. In some embodiments of the present disclosure, the reflective layer is formed by a single patterning process along with the source and drain electrodes in the thin-film transistor. Therefore, the manufacturing process can be simplified and the production cost can be reduced. In other embodiments of the present disclosure, the reflective layer may not be formed through a single patterning process with the source and drain electrodes in the thin-film transistor. Specifically, the source and drain electrodes may be formed first and then the reflective layer may be formed, or the reflective layer may be formed first and then the source and drain electrodes may be formed. Therefore, there are various methods for preparing the reflective layer, and the prepared reflective layer has an excellent effect of protecting the active layer.

According to an embodiment of the present disclosure, forming the at least part of the pixel unit further includes a step of forming a barrier wall in the light-emitting area, the barrier wall includes a first sublayer, a second sublayer, and a third sublayer from bottom to top. The first sublayer and the buffer layer in the thin-film transistor are formed by a single patterning process; the second sublayer and the gate insulating layer in the thin-film transistor are formed by a single patterning process; and the third sublayer and the interlayer insulation layer in the thin-film transistor are formed by a patterning process. Therefore, the manufacturing process can be simplified and the production cost can be reduced. It should be noted that the first sublayer, the second sublayer, and the third sublayer are the same as those described in foregoing description, and will not be described in detail here.

According to an embodiment of the present disclosure, forming the at least a part of the pixel unit further includes a step of forming a planarization layer in the light-emitting area, and the planarization layer and the ultraviolet blocking wall in the light blocking member are formed by a single process. Specifically, the material forming the planarization layer is coated on the surface of the thin-film transistor and the reflective layer, and the material is filled in the gap between the reflective layer and the barrier wall and covers the barrier wall, and the planarization layer is obtained after drying the material. Therefore, the manufacturing process can be simplified and the production cost can be reduced. Further, the entire planarization layer is made of the same material as the ultraviolet blocking wall, which can further improve the effect of blocking ultraviolet light transmission and effectively achieve the effect of fully protecting the active layer.

In some specific embodiments of the present disclosure, a top-gate thin-film transistor is used as an example of the thin-film transistor in a light-emitting area to describe the steps of forming the light-emitting area. It should be noted that the following description is only used to explain the present application, and cannot be understood as a limitation on the present application. The steps of forming a pixel unit include:

1. depositing a whole first metal layer on a first surface of a substrate in a thin-film transistor, and performing an etching treatment on the first metal layer to obtain a shield layer;

2. coating a whole first insulating layer on the first surface of the substrate, and forming a buffer layer after the first insulating layer is dried, wherein the buffer layer covers the shield layer;

3. forming a whole semiconductor layer on the surface of the buffer layer away from the substrate by a deposition or sputtering method, and performing an etching treatment on the semiconductor layer to obtain an active layer;

4. coating a whole second insulating layer on a surface of the buffer layer away from the substrate, and forming a gate insulating layer after the second insulating layer is dried, wherein the gate insulating layer covers the active layer;

5. forming a whole second metal layer on the surface of the gate insulating layer away from the substrate by a deposition or sputtering method, and performing an etching treatment on the second metal layer to obtain a gate electrode;

6. coating a whole third insulating layer on a surface of the gate insulating layer away from the substrate, and forming an interlayer insulating layer after the third insulating layer is dried, wherein the interlayer insulating layer covers the gate electrode;

7. forming two vias through the interlayer insulating layer and the gate insulating layer by an etching method;

8. forming a groove through the buffer layer, the gate insulating layer, and the interlayer insulating layer by an etching method to form a barrier wall;

9. forming a whole third metal layer on the surface of the interlayer insulating layer away from the substrate by a deposition or sputtering method, wherein during the process of forming the third metal layer, the metal material is connected to the active layer through the via, and the third metal layer covers the buffer layer on the side thereof facing the transparent areas, the gate insulating layer and the interlayer insulating layer in the thin-film transistor, and etching the third metal layer to obtain a source electrode, a drain electrode, and a reflective layer, wherein the reflective layer covers the buffer layer, the gate insulating layer, and the interlayer insulating layer in the thin-film transistor on the side thereof facing the transparent areas and extends to a surface of the part of the interlayer insulating layer away from the substrate;

10. coating a whole fourth insulating layer on a surface of the interlayer insulating layer away from the substrate, and forming a passivation layer after the fourth insulating layer is dried; and 11. coating a whole fifth insulating layer on a surface of the passivation layer away from the substrate, forming a planarization layer after the fifth insulating layer is dried, the planarization layer covering the source electrode, the drain electrode, the reflective layers and the barrier wall, and fill the gap between the reflective layer and the barrier wall.

In other specific embodiments of the present disclosure, the step of forming a pixel unit includes:

1. depositing a whole first metal layer on a first surface of a substrate in a thin-film transistor, and perform an etching treatment on the first metal layer to obtain a shield layer;

2. coating a whole first insulating layer on the first surface of the substrate, and forming a buffer layer after the first insulating layer is dried, wherein the buffer layer covers the shield layer;

3. forming a whole semiconductor layer on the surface of the buffer layer away from the substrate by a deposition or sputtering method, and performing an etching treatment on the semiconductor layer to obtain an active layer;

4. coating a whole second insulating layer on a surface of the buffer layer away from the substrate, and forming a gate insulating layer after the second insulating layer is dried, wherein the gate insulating layer coveres the active layer;

5. forming a whole second metal layer on the surface of the gate insulating layer away from the substrate by a deposition or sputtering method, and performing an etching treatment on the second metal layer to obtain a gate electrode;

6. coating a whole third insulating layer on a surface of the gate insulating layer away from the substrate, and forming an interlayer insulating layer after the third insulating layer is dried, wherein the interlayer insulating layer covers the gate electrode;

7. forming two vias through the layer insulation layer and the gate insulation layer by an etching method;

8. forming a whole third metal layer on the surface of the interlayer insulating layer away from the substrate by a deposition or sputtering method, wherein during the process of forming the third metal layer, the metal material is connected to the active layer through a via and the third metal layer covers the buffer layer on the side thereof facing the transparent areas, the gate insulating layer and the interlayer insulating layer in the thin-film transistor, and etching the third metal layer to obtain a source electrode, a drain electrode, and a reflective layer, wherein the reflective layer covers the buffer layer, the gate insulating layer, and the interlayer insulating layer in the thin-film transistor on the side thereof facing the transparent areas and extends to a surface of the part of the interlayer insulating layer away from the substrate;

9. coating a whole fourth insulating layer on a surface of the interlayer insulating layer away from the substrate, and after the fourth insulating layer is dried forming the passivation layer; and 10. coating a whole fifth insulating layer on a surface of the passivation layer away from the substrate, forming a planarization layer after the fifth insulating layer is dried, wherein the planarization layer covers the source electrode, the drain electrode, and reflective layers.

According to the embodiments of the present disclosure, in a general transparent display device, external light irradiated from the transparent area to the light-emitting area will affect the electron migration of the active layer of the thin-film transistor, thereby causing poor light stability of the thin-film transistor and short life of the device. In the present application, by providing a light blocking member in the light-emitting area, the effect of external light on the thin-film transistor can be effectively reduced, so that the thin-film transistor has strong light stability, excellent performance, and long life. Further, the structure of the transparent display device in the present application can enable to select as many light-blocking materials as possible, such as a shield layer and a light-blocking component, on the premise of ensuring the area of the transparent area, thereby further improving the product yield and use performance of the transparent display device.

In the description of this disclosure, it needs to be understood that the directions or positional relations indicated by the terms "width", "top", "bottom", "front", "back", "left", "right", "top", "bottom", "inner" and "outer" and so on are based on the positional or positional relations shown in the drawings, and are only for the convenience of describing the present disclosure and simplifying the description, rather than indicating or implying that the device or element referred to must have a specific orientation and be constructed and operated in a particular orientation, and they cannot be understood as a limitation on the present disclosure.

In addition, the terms "first" and "second" are used for descriptive purposes only, and cannot be understood as indicating or implying relative importance or implicitly indicating the number of the technical features indicated. Therefore, the features defined as "first" and "second" may explicitly or implicitly include one or more of the features. In the description of the present disclosure, the meaning of "a plurality" is two or more, unless specifically defined otherwise.

In this disclosure, unless explicitly stated and defined otherwise, the first feature "on" or "below" the second feature may refer to the situation in which the first and second features direct contact, or the first and second features indirectly contact through an intermediate medium.

In the description of this specification, the description with reference to the terms "one embodiment", "some embodiments", "examples", "specific examples", or "some examples" and the like means specific feature, structure, material, or characteristic described in conjunction with the embodiments or examples is included in at least one embodiment or example of the present disclosure. In this specification, the schematic expressions of the above terms are not necessarily directed to the same embodiment or example. Moreover, the particular features, structures, materials, or characteristics described may be combined in any suitable manner in any one or more embodiments or examples. In addition, without any contradiction, those skilled in the art may combine and intergrate different embodiments or examples and features of the different embodiments or examples described in this specification.

Although the embodiments of the present disclosure have been shown and described above, it can be understood that the above embodiments are exemplary and should not be construed as limitations on the present disclosure. Those skilled in the art can make any change, modification, substitution, and modification for the above embodiments within the scope of the present disclosure.

What is claimed is:

1. A substrate comprising:
    a plurality of pixel units, at least a part of which includes a light-emitting area and a transparent area, and the light-emitting area includes a thin-film transistor;
    a light blocking member disposed in the light-emitting area and configured to block light that is directed to the thin-film transistor through the transparent area,
    wherein the light blocking member includes a reflective layer, the thin-film transistor includes a plurality of insulating layers, and the reflective layer covers at least a part of the plurality of insulating layers on a side thereof facing the transparent area,
    wherein the light blocking member further comprises an ultraviolet blocking wall, the ultraviolet blocking wall is located in the light-emitting area, and the ultraviolet blocking wall is located on a side of the reflective layer near the transparent area, and
    wherein the light-emitting area further comprises a planarization layer covering the thin-film transistor and the reflective layer, and at least a part of the planarization layer constitutes the ultraviolet blocking wall,
    wherein a barrier wall is further provided in the light-emitting area, the barrier wall is located on the side of the reflective layer near the transparent area, and the ultraviolet blocking wall is located in a gap between the reflective layer and the barrier wall,
    the barrier wall comprises a first sublayer, a second sublayer, and a third sublayer from bottom to top,
    wherein the first sublayer and a buffer layer in the thin-film transistor are formed by a patterning process;
    the second sublayer and a gate insulation layer in the thin-film transistor are formed by a patterning process; and
    the third sublayer and an interlayer insulating layer in the thin-film transistor are formed by a patterning process.

2. The substrate according to claim 1, wherein the plurality of insulating layers include an interlayer insulating layer and a gate insulating layer, or the plurality of insulating layers include an interlayer insulating layer.

3. The substrate according to claim 2, wherein an orthographic projection of the reflective layer on the substrate and an orthographic projection of the interlayer insulating layer on the substrate partially overlap with each other.

4. The substrate according to claim 1, wherein a material forming the reflective layer includes metal.

5. The substrate according to claim 1, wherein a distance between the reflective layer and the barrier wall is 2-3 micrometers.

6. The substrate according to claim 1, wherein the reflective layer covers at least a part of the barrier wall on a side thereof facing the thin-film transistor.

7. The substrate according to claim 1, wherein a material forming the ultraviolet blocking wall comprises a material having a transmittance of less than 20%.

8. The substrate according to claim 7, wherein the material forming the ultraviolet blocking wall comprises a polyimide-based organic material.

9. The substrate according to claim 1, wherein the light-blocking member further comprises a second reflective layer, and the second reflective layer covers at least a second part of the plurality of insulating layers on a second side thereof facing a transparent area in an adjacent pixel unit.

10. A transparent display device comprising a substrate, the substrate comprising:
    a plurality of pixel units, at least a part of which includes a light-emitting area and a transparent area, and the light-emitting area includes a thin-film transistor;
    a light blocking member disposed in the light-emitting area and configured to block light that is directed to the thin-film transistor through the transparent area,
    wherein the light blocking member includes a reflective layer, the thin-film transistor includes a plurality of insulating layers, and the reflective layer covers at least a part of the plurality of insulating layers on a side thereof facing the transparent area,
    the light blocking member further comprises an ultraviolet blocking wall, the ultraviolet blocking wall is located in the light-emitting area, and the ultraviolet blocking wall is located on a side of the reflective layer near the transparent area, and
    the light-emitting area further comprises a planarization layer covering the thin-film transistor and the reflective layer, and at least a part of the planarization layer constitutes the ultraviolet blocking wall,
    wherein a barrier wall is further provided in the light-emitting area, the barrier wall is located on the side of the reflective layer near the transparent area, and the ultraviolet blocking wall is located in a gap between the reflective layer and the barrier wall,
    the barrier wall comprises a first sublayer, a second sublayer, and a third sublayer from bottom to top,
    wherein the first sublayer and a buffer layer in the thin-film transistor are formed by a patterning process;
    the second sublayer and a gate insulation layer in the thin-film transistor are formed by a patterning process; and
    the third sublayer and an interlayer insulating layer in the thin-film transistor are formed by a patterning process.

11. A method for manufacturing a substrate, the substrate comprising a plurality of pixel units, at least a part of which includes a light-emitting area and a transparent area, and the light-emitting area includes a thin-film transistor; a light blocking member disposed in the light-emitting area and configured to block light that is directed to the thin-film transistor through the transparent area,
    the method comprising:
    forming the plurality of pixel units;
    wherein forming at least a part of the plurality of pixel units includes forming the thin-film transistor and the light blocking member in the light-emitting area,
    wherein the light blocking member includes a reflective layer, the thin-film transistor includes a plurality of insulating layers, and the reflective layer covers at least a part of the plurality of insulating layers on a side thereof facing the transparent area, wherein the light blocking member further comprises an ultraviolet blocking wall, the ultraviolet blocking wall is located in the light-emitting area, and the ultraviolet blocking wall is located on a side of the reflective layer near the transparent area, and wherein forming at least a part of the plurality of pixel units further comprises a step of forming a planarization layer, and a part of the planarization layer is filled in a gap between the reflective layer and a barrier wall, and the part of the planarization layer filled in the gap constitutes the ultraviolet blocking wall, wherein the barrier wall is further provided in the light-emitting area, the barrier wall is located on the side of the reflective layer near the transparent area, and the ultraviolet blocking wall is located in a gap between the reflective layer and the barrier wall, the barrier wall comprises a first sublayer, a second sublayer, and a third sublayer from bottom to top, wherein the first sublayer and a buffer layer in the thin-film transistor are formed by a patterning process;

the second sublayer and a gate insulation layer in the thin-film transistor are formed by a patterning process; and the third sublayer and an interlayer insulating layer in the thin-film transistor are formed by a patterning process.

12. The method according to claim 11, wherein the reflective layer and source and drain electrodes of the thin-film transistor are formed by a single patterning process.

13. The method according to claim 12, wherein forming at least a part of the plurality of pixel units further comprises the step of forming the barrier wall, the barrier wall is located on a side of the reflective layer near the transparent area, and the ultraviolet blocking wall is located in the gap between the reflective layer and the barrier wall, the barrier wall comprises a first sublayer, a second sublayer, and a third sublayer from bottom to top, wherein the first sublayer and a buffer layer in the thin-film transistor are formed by a patterning process;

the second sublayer and a gate insulation layer in the thin-film transistor are formed by a patterning process; and the third sublayer and an interlayer insulating layer in the thin-film transistor are formed by a patterning process.

* * * * *